(12) United States Patent
Yaegashi

(10) Patent No.: US 10,074,557 B2
(45) Date of Patent: Sep. 11, 2018

(54) PATTERN FORMING METHOD

(71) Applicant: Tokyo Electron Limited, Tokyo (JP)

(72) Inventor: Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/602,307

(22) Filed: May 23, 2017

(65) Prior Publication Data

US 2017/0352584 A1 Dec. 7, 2017

(30) Foreign Application Priority Data

Jun. 6, 2016 (JP) ................................ 2016-112744

(51) Int. Cl.
*H01L 21/768* (2006.01)
*H01L 21/033* (2006.01)
*H01L 21/02* (2006.01)

(52) U.S. Cl.
CPC .... *H01L 21/76802* (2013.01); *H01L 21/0237* (2013.01); *H01L 21/0332* (2013.01); *H01L 21/0337* (2013.01); *H01L 21/0338* (2013.01); *H01L 21/76832* (2013.01); *H01L 21/76879* (2013.01)

(58) Field of Classification Search
CPC ......... H01L 21/76802; H01L 21/76832; H01L 21/0237; H01L 21/0332; H01L 21/0337; H01L 21/0338
See application file for complete search history.

(56) References Cited

U.S. PATENT DOCUMENTS

| | | | | |
|---|---|---|---|---|
| 6,294,833 B1* | 9/2001 | Usami | ............... | H01L 21/76801 257/758 |
| 2002/0006721 A1* | 1/2002 | Thomas | ............ | H01L 21/76802 438/639 |
| 2003/0127426 A1* | 7/2003 | Chang | ................. | H01L 21/0337 216/41 |
| 2007/0099431 A1* | 5/2007 | Li | ....................... | H01L 21/3081 438/735 |
| 2009/0209105 A1* | 8/2009 | Yaegashi | ............. | H01L 21/0273 438/694 |
| 2009/0209109 A1* | 8/2009 | Yaegashi | ............. | H01L 21/0337 438/736 |
| 2010/0221921 A1* | 9/2010 | Kwon | ................. | H01L 21/0337 438/699 |

(Continued)

FOREIGN PATENT DOCUMENTS

JP 2014-056864 3/2014

*Primary Examiner* — Tom Thomas
*Assistant Examiner* — Christopher M Roland
(74) *Attorney, Agent, or Firm* — IPUSA, PLLC

(57) ABSTRACT

A first film having a repetitive line pattern is formed on an under film. A second film is formed on a side surface of the first film. The second film has an etching selectivity different from that of the first film. A third film is formed on an upper surface and a side surface of the second film. The third film has an etching selectivity different from those of the first and second films. A resist pattern with an opening is formed on the third film. A recess that exposes upper surfaces of the first, second and third films is formed by etching the third film by using the resist pattern as an etching mask. An upper surface of the under film is exposed by etching the first and third films. A through hole that penetrates through the under film is formed by etching the under film.

5 Claims, 19 Drawing Sheets

(56) References Cited

U.S. PATENT DOCUMENTS

| | | | | |
|---|---|---|---|---|
| 2012/0103935 A1* | 5/2012 | Cheng | ................ | H01L 21/0337 216/37 |
| 2012/0202301 A1* | 8/2012 | Yaegashi | ............... | G03F 7/0035 438/8 |
| 2015/0243519 A1* | 8/2015 | deVilliers | ........... | H01L 21/0337 438/692 |

* cited by examiner

PATTERN FORMING METHOD

CROSS-REFERENCE TO RELATED APPLICATIONS

This patent application is based upon and claims the priority to Japanese Patent Application No. 2016-112744 filed on Jun. 6, 2016, the entire contents of which are incorporated herein by reference.

BACKGROUND OF THE INVENTION

1. Field of the Invention

The present disclosure relates to a pattern forming method.

2. Description of the Related Art

As densification and integration of semiconductor devices develop, widths of interconnection patterns and widths of isolation patterns required in semiconductor manufacturing processes are likely to become smaller. Such fine patterns are formed by forming resist patterns using photolithography technology and by etching a variety of underlayer thin films, as described in Japanese Laid-Open Patent Application Publication No. 2014-056864.

To form the fine patterns, the photolithography technology is important, and demands for pattern miniaturization reach a level of the resolution limit or smaller of the photolithography technology. For example, one dimension (1D) layout technology to form a predetermined pattern by using only one dimension pattern elements is known as a technology for forming a fine pattern smaller than the resolution limit.

The 1D layout technology is a technique that forms a predetermined pattern by forming a repeated line pattern on an under film by using the photolithography technology including an exposure process and by partially removing the formed line pattern.

In the meantime, in the 1D layout technology, the repeated line pattern can be formed by spacer type double patterning without increasing the number of the exposure processes, but the number of exposure processes for partially removing the formed line pattern is likely to increase. This is because exposure masks have to be divided into dimensions that the photolithography can resolve when the line pattern is partially removed. Thus, when the number of the exposure processes increases, the manufacturing cost increases.

SUMMARY OF THE INVENTION

Accordingly, embodiments of the present disclosure may provide a new and useful pattern forming method that can decrease the number of exposure processes in pattern formation using the 1D layout technology.

More specifically, there is provided a film deposition apparatus for sequentially supplying at least two reaction gases, which mutually react, into a chamber to deposit a film on a substrate. The film deposition apparatus includes a chamber, and a turntable provided in the chamber and configured to be rotatable. The turntable includes a concave portion in an upper surface. A bottom portion of the concave portion has a through hole. A substrate supporting member is detachably placed on the concave portion. A part of a lower surface of the substrate supporting member is exposed through the through hole of the concave portion. An upper surface of the substrate supporting member includes a receiving portion to receive the substrate thereon. A drive mechanism is configured to move up and down the turntable and rotate the turntable. A rotary unit is provided under the turntable and in the chamber and configured to be rotatable by supplying air thereto. An air supply unit is provided around the rotary unit and configured to supply air to the rotary unit to rotate the rotary unit. A controller is configured to cause the drive mechanism to rotate the turntable so that the through hole is located just above the rotary unit, and to cause the drive mechanism to move down the turntable so that the rotary unit supports the exposed lower surface of the substrate supporting member. The controller causes the air supply unit to supply air to the rotary unit while the rotary unit supports the exposed lower surface of the substrate supporting member so that the substrate supporting member rotates a predetermined angle relative to the turntable.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

Embodiments of the present disclosure are described below with reference to accompanying drawings. Through all figures illustrating the embodiments, the same references symbols are used for portions having the same function, and repetitive explanations of these portions are omitted.

The pattern forming method according to an embodiment is to form a fine pattern by using a 1D layout technology, and can be applied to manufacture of logic circuits and MPU (Micro-Processing Unit), for example. The pattern forming method of the embodiment particularly helps form a fine pattern having a dimension that is smaller than the resolution limit of a photolithography technology.

To begin with, in the pattern forming method of the embodiment, a first film having a repeated line pattern is formed on an under film, and a second film having an etching selectivity different from an etching selectivity of the first film is formed on a side surface of the first film. Next, a third film having an etching selectivity different from the etching selectivities of the first film and the second film is formed on an upper surface and a side surface of the second film. Subsequently, a resist pattern having an opening is formed on the third film, and a recess in which the upper surface of the first film, the upper surface of the second film and the upper surface of the third film are exposed, is formed. Next, the upper surface of the under film is exposed by etching the first film and the third film having the exposed upper surfaces in the recess (by partially removing the line pattern) so as to leave the second film having the exposed upper surface in the recess. Subsequently, by etching the under film having the exposed upper surface, a through hole penetrating through the under film is formed. Here, that the "etching selectivity is different" means that etching rates are different under the same etching conditions. Thus, the number of etching processes (i.e., the number of exposure masks used in the exposure processes) can be reduced. The reason why the number of the exposure processes can be reduced is described later.

Figure 1:
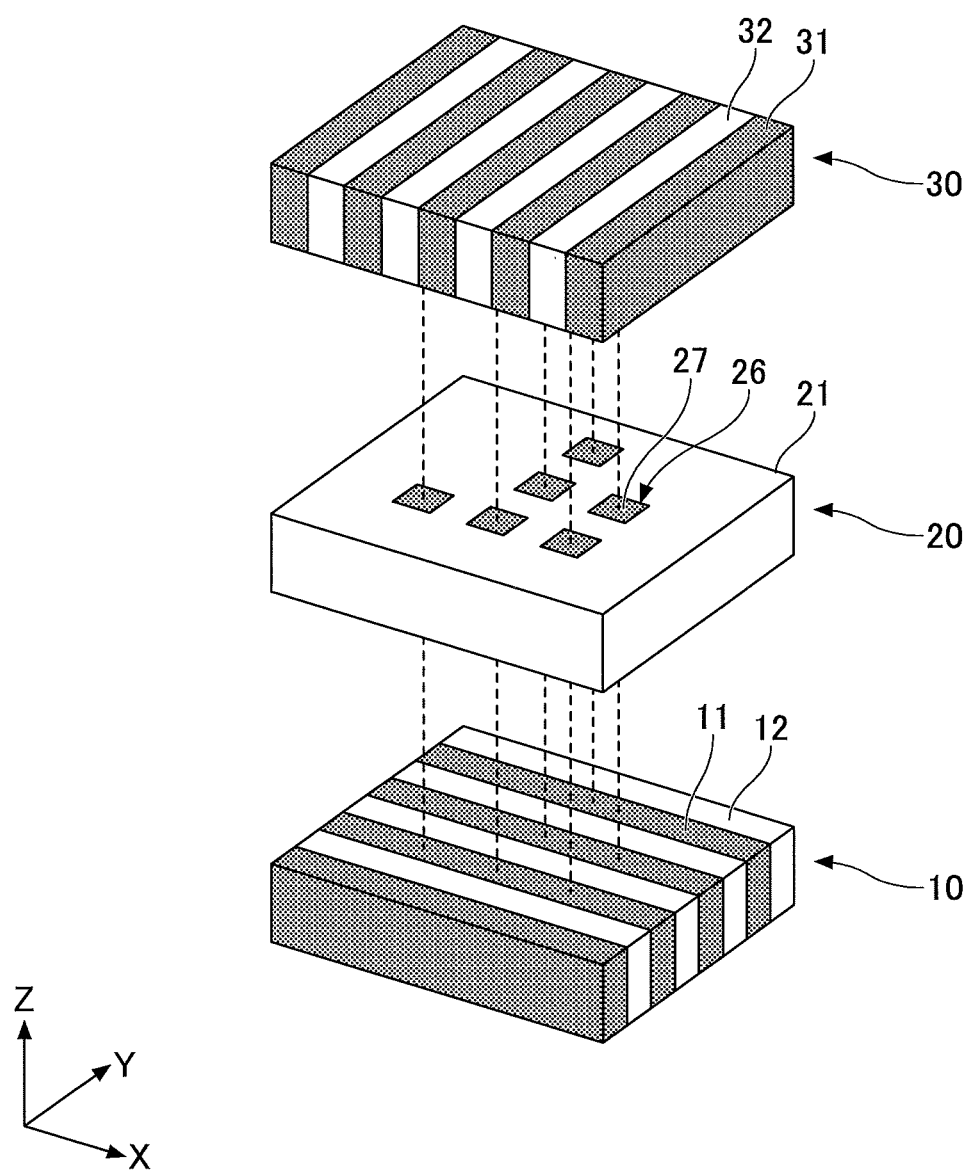
FIG. 1 is a diagram for explaining a pattern formed by a pattern forming method according to an embodiment.

FIG. 1 is a diagram for explaining a pattern formed by the pattern forming method according to the embodiment. In FIG. 1, three stacked layers (a first layer 10, a second layer 20, and a third layer 30) are illustrated by being exploded for the sake of convenience.

As illustrated in FIG. 1, the first layer 10 is an interconnection layer, and includes metal films 11 and insulating films 12. The metal films 11 serves as interconnections to let currents flow therethrough, and are formed so as to extend in a first direction (X direction in FIG. 1), for example. The metal films 11 are formed of, for example, aluminum (Al), copper (Cu) and tungsten (W). The insulating films 12 serve to insulate the metal films 11.

The second layer 20 is formed on the first layer 10 (+Z side in FIG. 1), and includes an insulating film 21, via holes 26 penetrating through the insulating film 21, and conductive films 27 filled in the via holes 26. The insulating film 21 serves to insulate the first layer 10 from the third layer 30. The via holes 26 are through holes penetrating through the insulating film 21 between the lower surface of the insulating film 21 (surface on the −Z side in FIG. 1) and the upper surface of the insulating film 21 (surface on the +Z side). The conductive films 27 are filled in the via holes 26, and connect the metal films 11 of the first layer 10 with the metal films 31 of the third layer 30.

The third layer 30 is an interconnection layer formed on the second layer 20 (+Z side in FIG. 1), and includes metal films 31 and insulating films 32. The metal films 31 serve as interconnections to let currents flow therethrough, and are formed so as to extend in a second direction (Y direction in FIG. 1) perpendicular to the first direction, for example. The metal films 31 are made of, for example, Al, Cu or W. The insulating films 32 serve to insulate the metal films 31.

Figure 2:
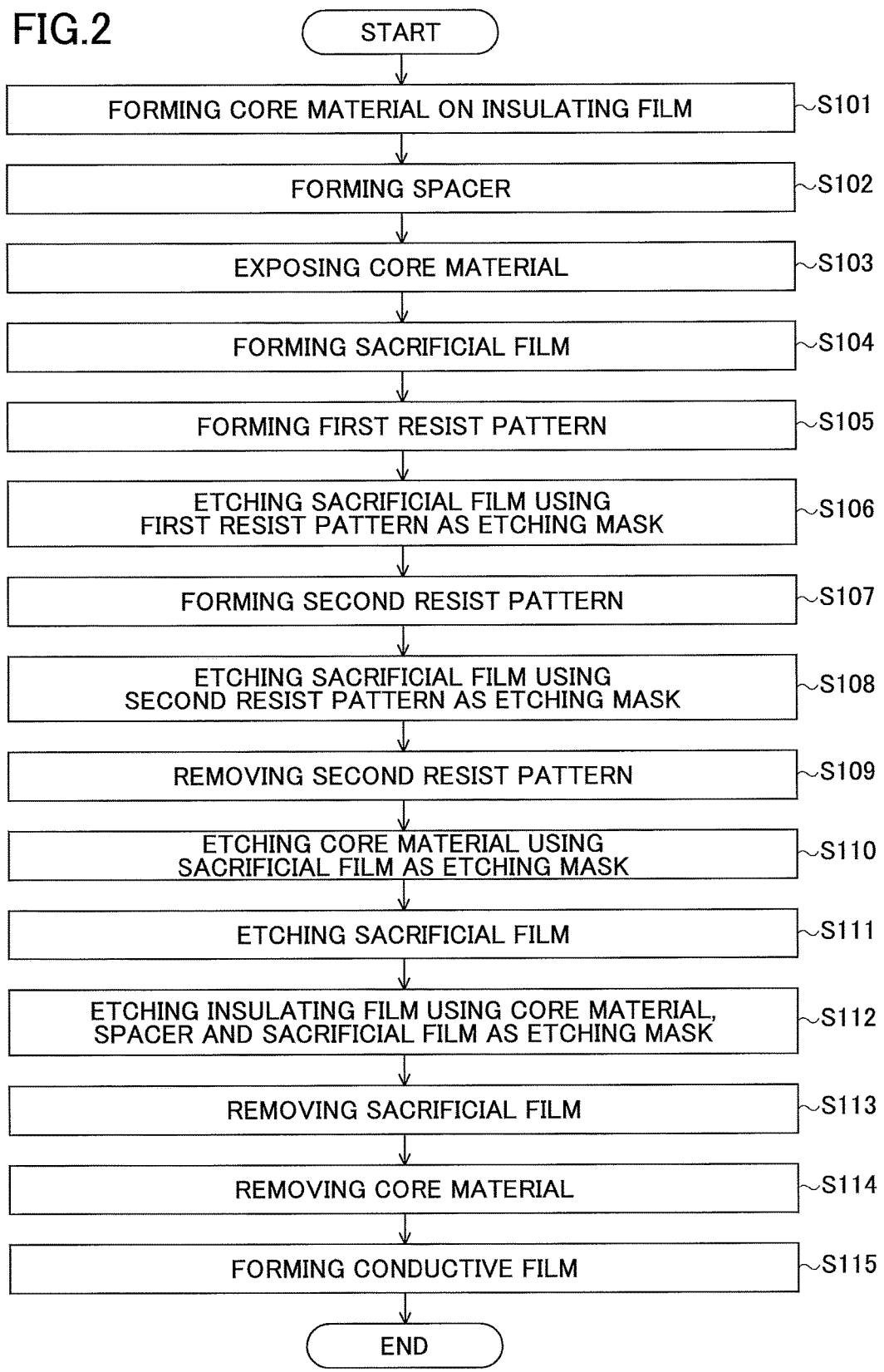
FIG. 2 is a flowchart for explaining a pattern formed by a pattern forming method according to an embodiment.
Figure 3A:
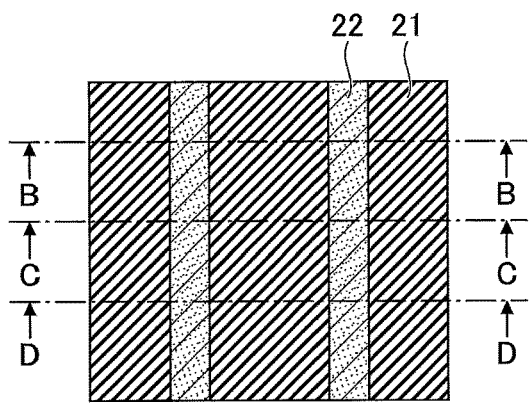
FIGS. 3A through 3D are first diagrams for explaining each process of a pattern forming method according to an embodiment.
Figure 3B:
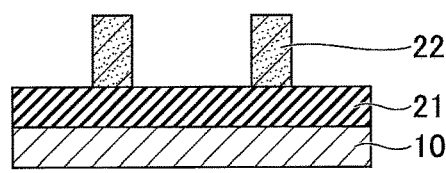
Figure 3C:
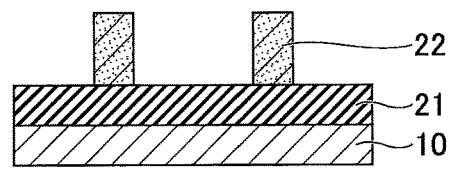
Figure 3D:
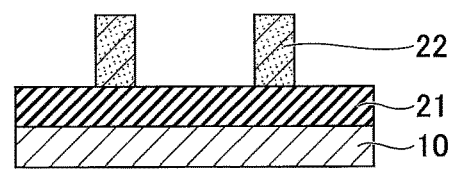
Figure 4A:
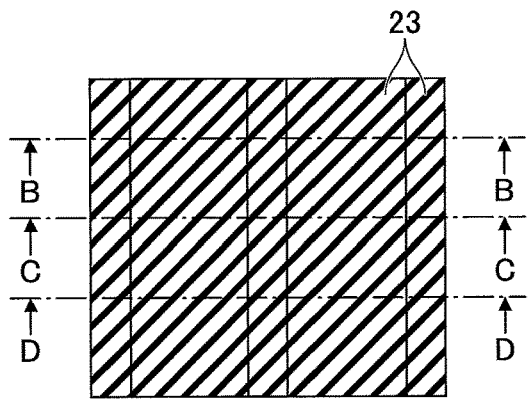
FIGS. 4A through 4D are second diagrams for explaining each process of a pattern forming method according to an embodiment.
Figure 4B:
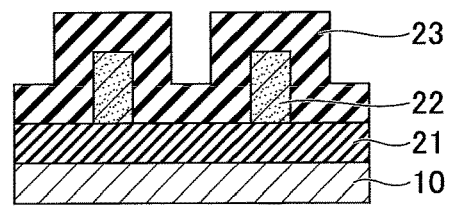
Figure 4C:
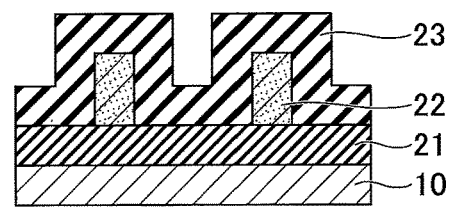
Figure 4D:
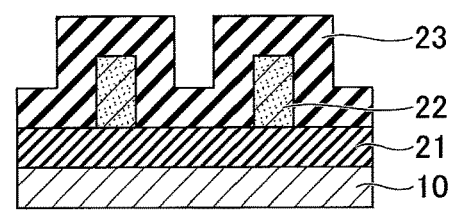
Figure 5A:
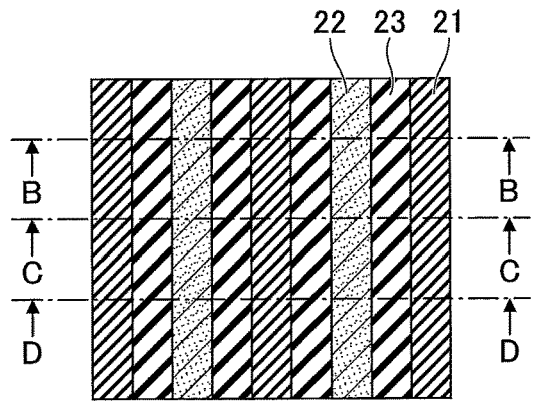
FIGS. 5A through 5D are third diagrams for explaining each process of a pattern forming method according to an embodiment.
Figure 5B:
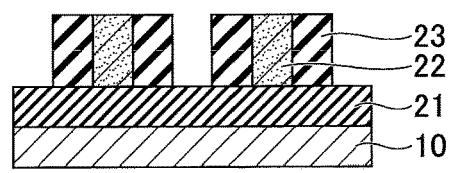
Figure 5C:
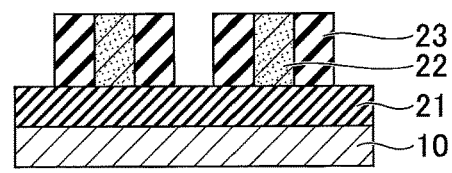
Figure 5D:
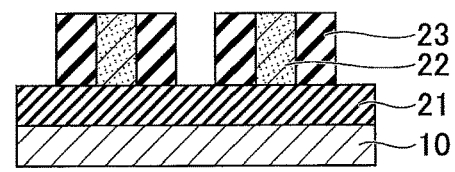
Figure 6A:
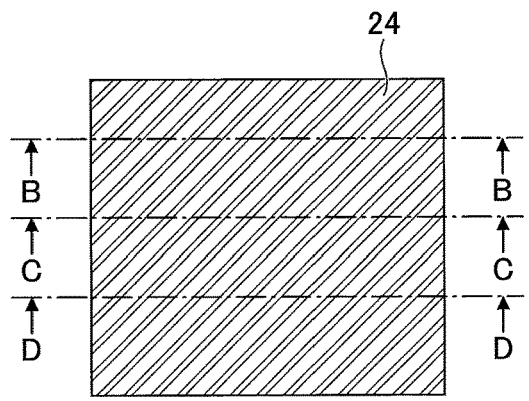
FIGS. 6A through 6D are fourth diagrams for explaining each process of a pattern forming method according to an embodiment.
Figure 6B:
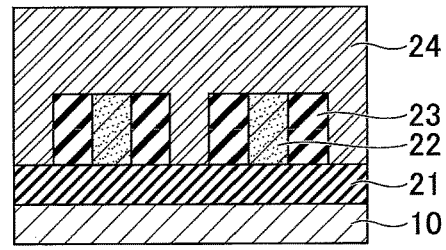
Figure 6C:
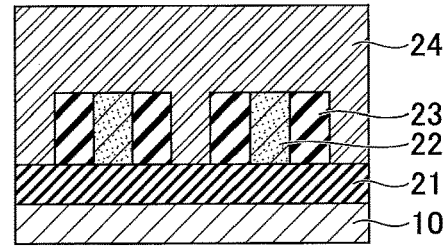
Figure 6D:
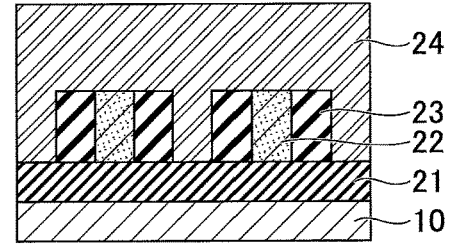
Figure 7A:
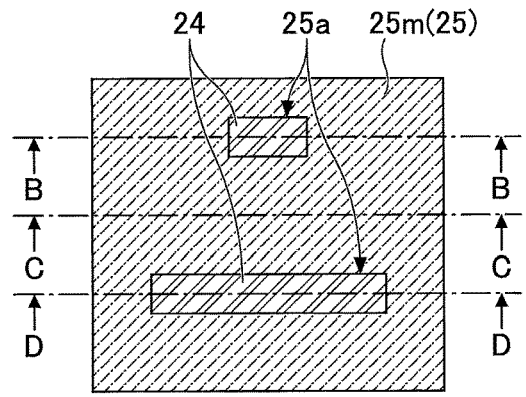
FIGS. 7A through 7D are fifth diagrams for explaining each process of a pattern forming method according to an embodiment.
Figure 7B:
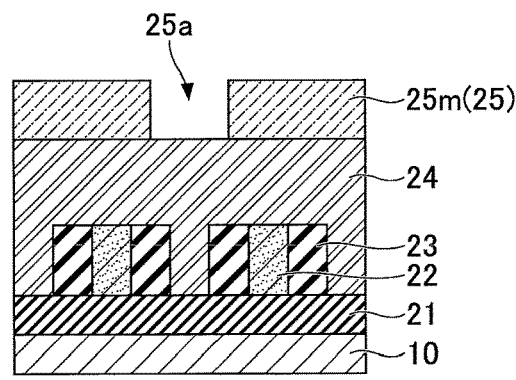
Figure 7C:
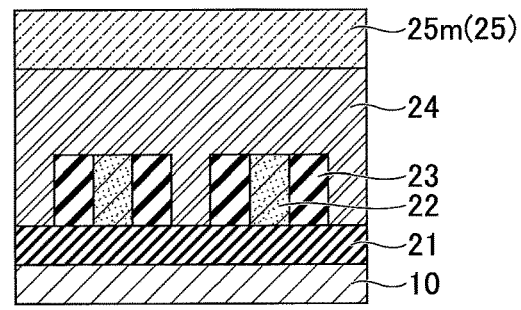
Figure 7D:
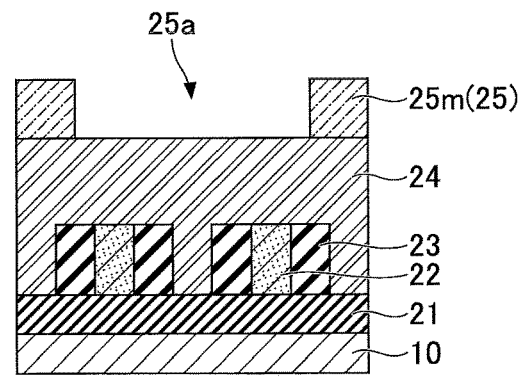
Figure 8A:
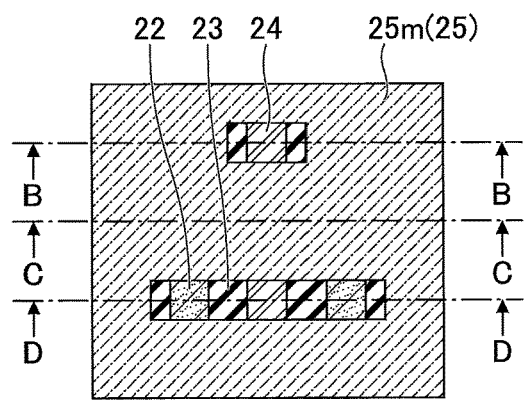
FIGS. 8A through 8D are sixth diagrams for explaining each process of a pattern forming method according to an embodiment.
Figure 8B:
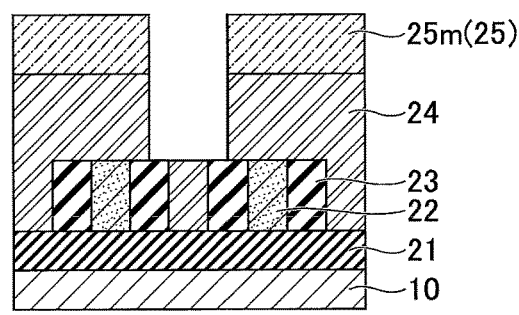
Figure 8C:
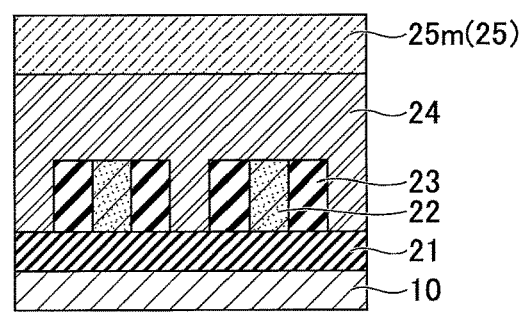
Figure 8D:
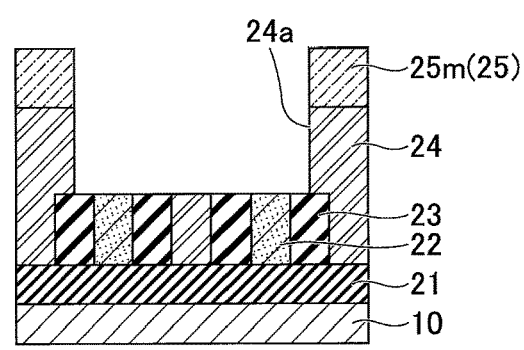
Figure 9A:
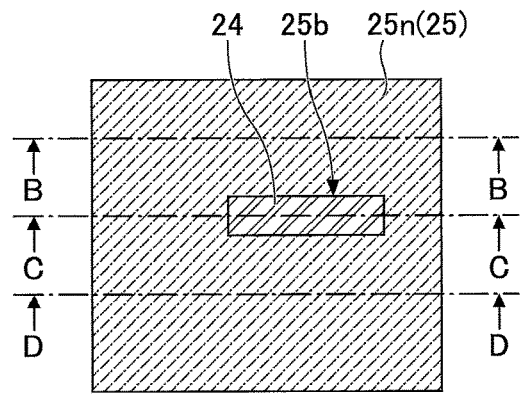
FIGS. 9A through 9D are seventh diagrams for explaining each process of a pattern forming method according to an embodiment.
Figure 9B:
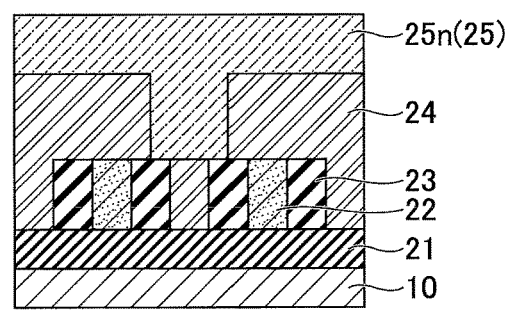
Figure 9C:
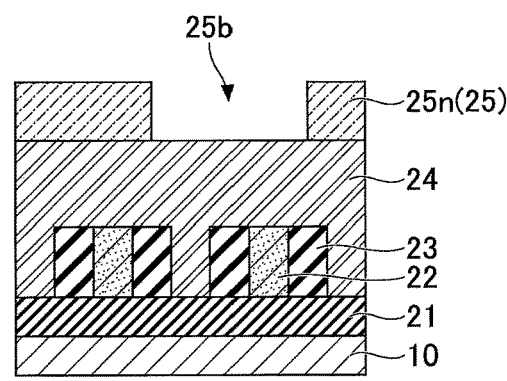
Figure 9D:
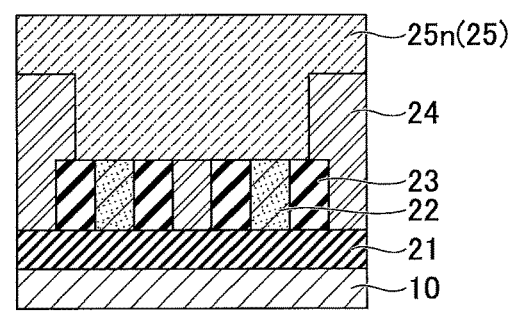
Figure 10A:
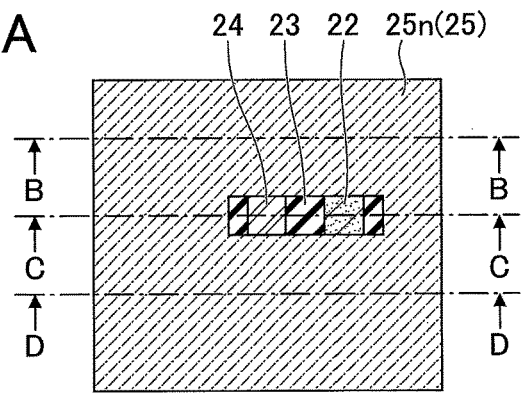
FIGS. 10A through 10D are eighth diagrams for explaining each process of a pattern forming method according to an embodiment.
Figure 10B:
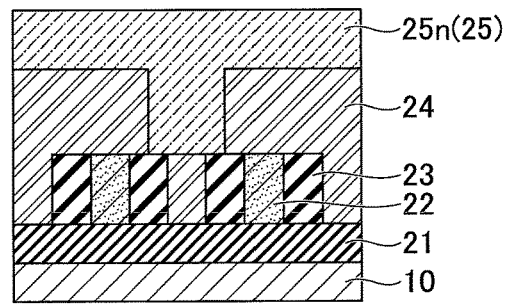
Figure 10C:
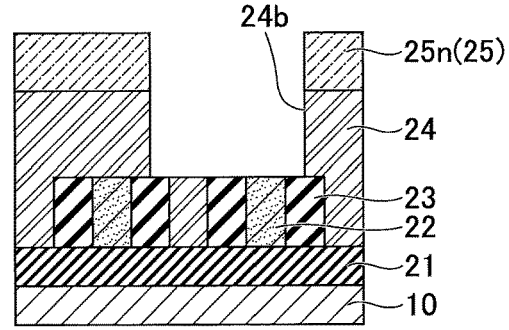
Figure 10D:
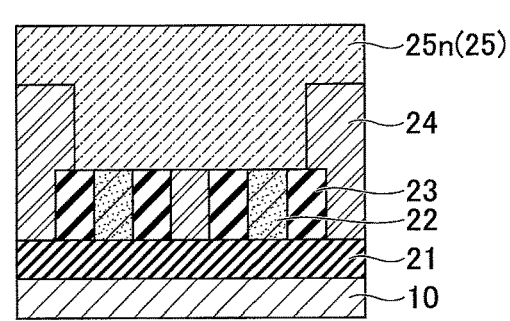
Figure 11A:
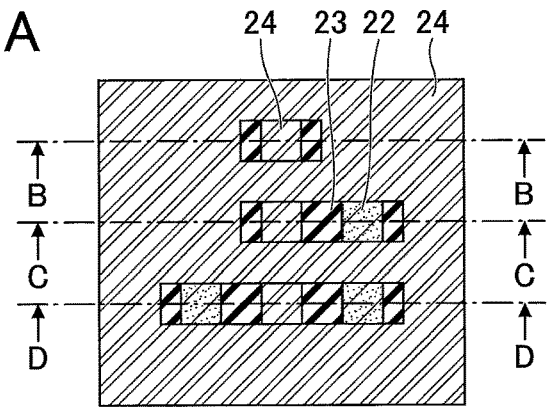
FIGS. 11A through 11D are ninth diagrams for explaining each process of a pattern forming method according to an embodiment.
Figure 11B:
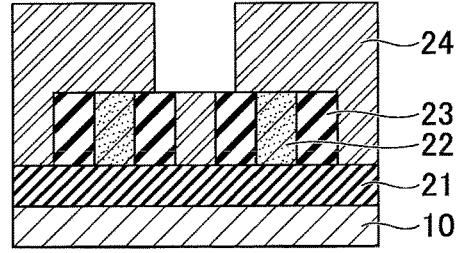
Figure 11C:
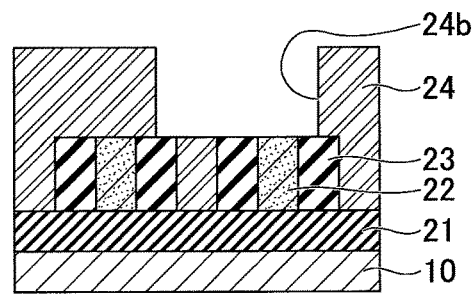
Figure 11D:
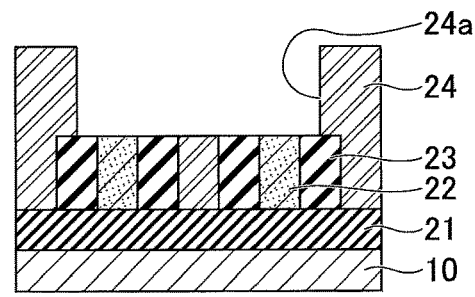
Figure 12A:
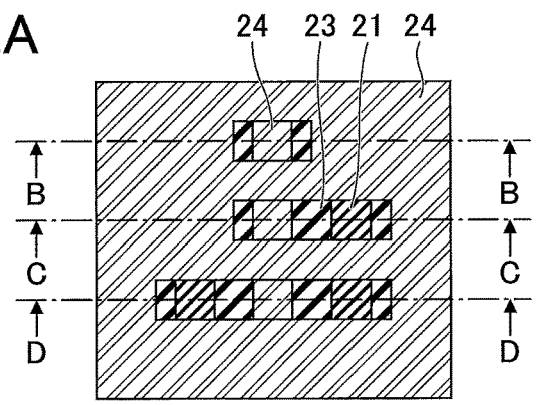
FIGS. 12A through 12D are tenth diagrams for explaining each process of a pattern forming method according to an embodiment.
Figure 12B:
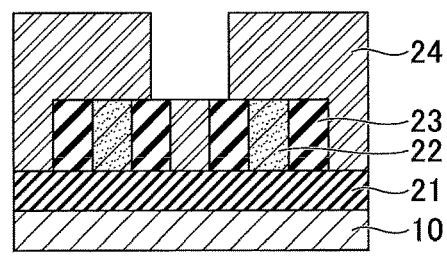
Figure 12C:
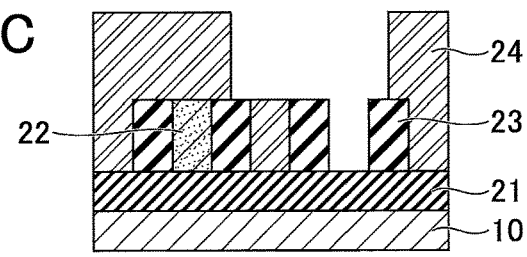
Figure 12D:
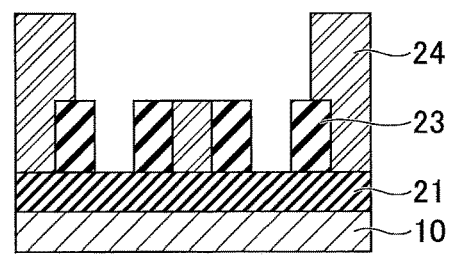
Figure 13A:
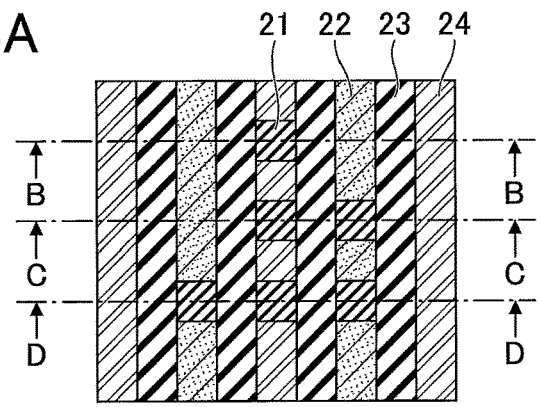
FIGS. 13A through 13D are eleventh diagrams for explaining each process of a pattern forming method according to an embodiment.
Figure 13B:
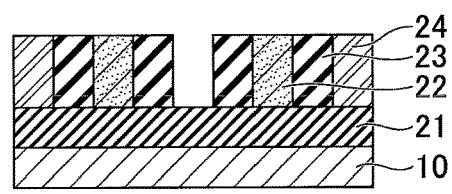
Figure 13C:
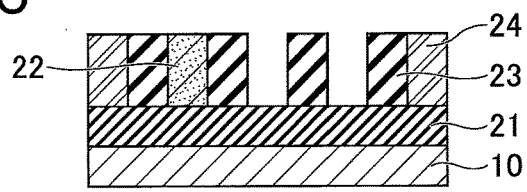
Figure 13D:
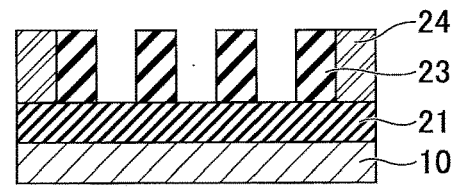
Figure 14A:
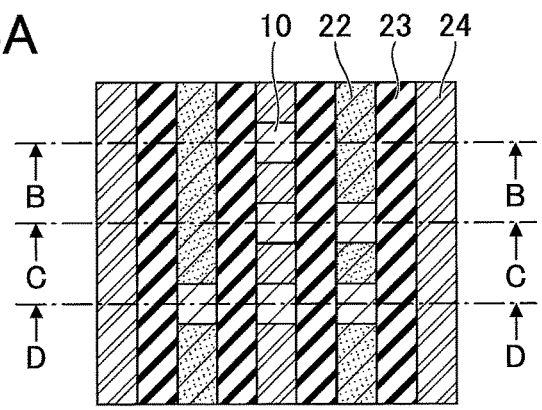
FIGS. 14A through 14D are twelfth diagrams for explaining each process of a pattern forming method according to an embodiment.
Figure 14B:
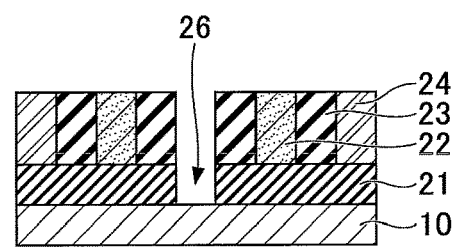
Figure 14C:
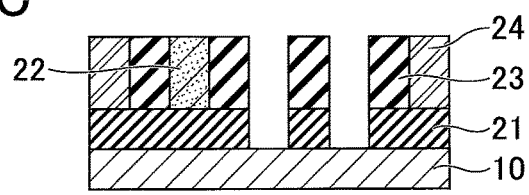
Figure 14D:
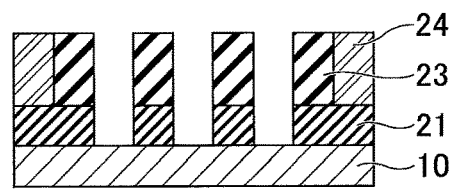
Figure 15A:
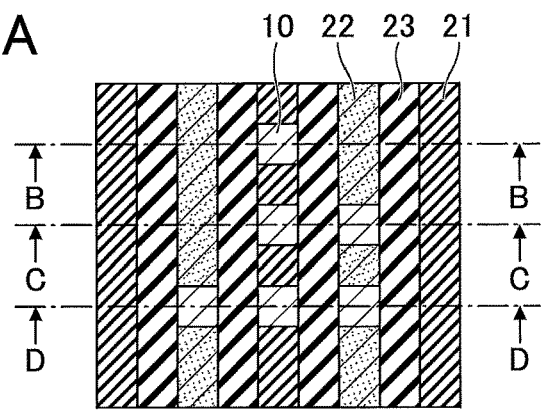
FIGS. 15A through 15D are thirteenth diagrams for explaining each process of a pattern forming method according to an embodiment.
Figure 15B:
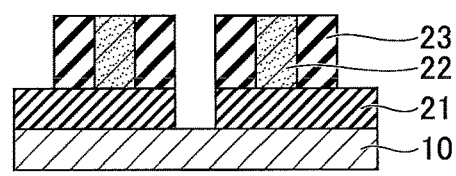
Figure 15C:
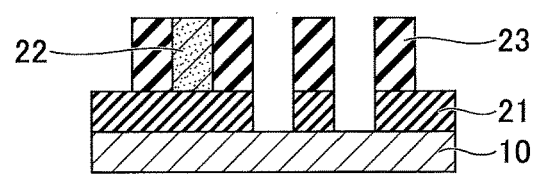
Figure 15D:
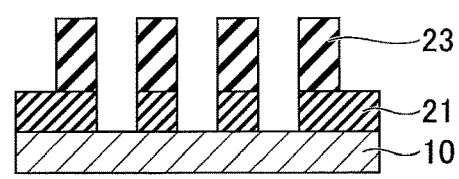
Figure 16A:
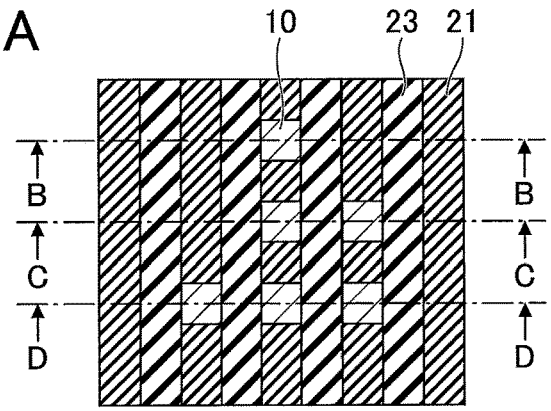
FIGS. 16A through 16D are fourteenth diagrams for explaining each process of a pattern forming method according to an embodiment.
Figure 16B:
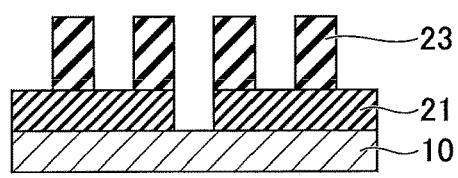
Figure 16C:
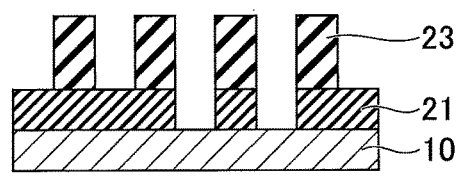
Figure 16D:
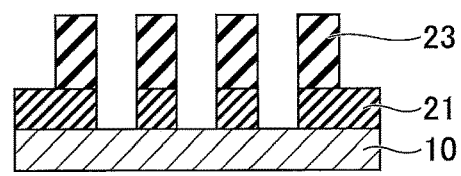
Figure 17A:
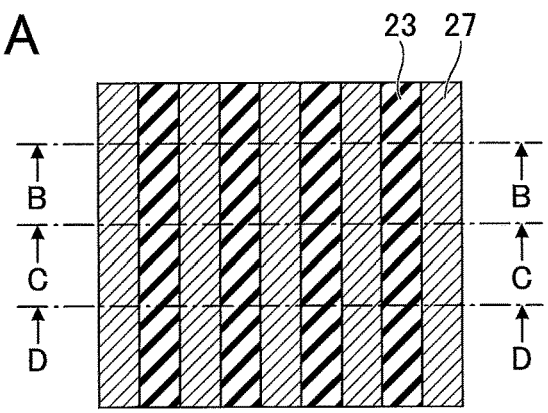
FIGS. 17A through 17D are fifteenth diagrams for explaining each process of a pattern forming method according to an embodiment.
Figure 17B:
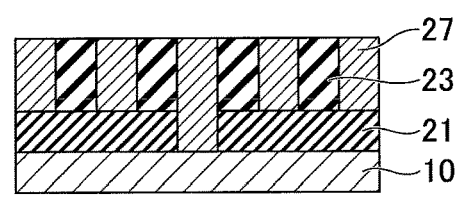
Figure 17C:
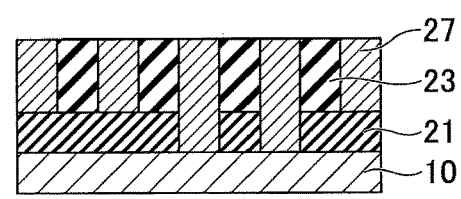
Figure 17D:
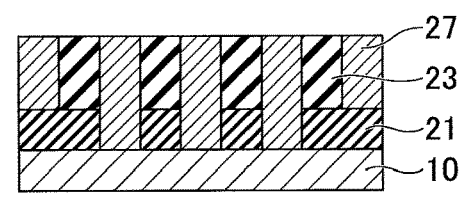

FIG. 2 is a flowchart for explaining a pattern forming method according to an embodiment.

As illustrated in FIG. 2, the pattern forming method of the embodiment includes steps of forming a core material on an insulating film (step S101), forming a spacer (step S102), exposing the core material (step S103), forming a sacrificial film (step S104), forming a first resist pattern (step S105), etching the sacrificial film by using the first resist pattern as an etching mask (step S106), forming a second resist pattern (step S107), etching the sacrificial film by using the second resist pattern as an etching mask (step S108), removing the second resist pattern (step S109), etching the core material by using the sacrificial film as an etching mask (step S110), etching the sacrificial film (step S111), etching the insulating film by using the core material, the spacer and the sacrificial film as an etching mask (step S112), removing the sacrificial film (step S113), removing the core material (step S114) and forming the conductive film (step S115).

Each process is described below with reference to FIGS. 3A through 17D. FIGS. 3A through 17D are diagrams for explaining each process of the pattern forming method according to an embodiment. Here, FIGS. 3A through 17A (3A, 4A, 5A, . . . , 17A) are top views in each of the processes. FIGS. 3B through 17B (3B, 4B, 5B, . . . , 17B) are cross-sectional views cut along a dashed-dotted line B-B. FIGS. 3C through 17C (3C, 4C, 5C, . . . , 17C) are cross-sectional views cut along a dashed-dotted line C-C. FIGS. 3D through 17D (3D, 4D, 5D, . . . , 17D) are cross-sectional views cut along a dashed-dotted line D-D.

In step S101, a core material is formed on an insulating film. More specifically, as illustrated in FIGS. 3 A through 3D, a core material 22 is formed on an insulating film 21 on a first layer 10 by CVD (Chemical Vapor Deposition), for example. Next, the core material 22 is patterned into a line-and-space shape including lines arranged at a predetermined space from the adjacent lines by being exposed to an ArF laser having a wavelength of 193 nm and by being developed. Subsequently, a process for thinning the line of the patterned core materials 22 (which is referred to as a "slimming process" hereinafter) is performed, thereby forming a fine pattern having a dimension that is smaller than the resolution limit of the photolithography technology. The insulating film 21 serves as an interlayer insulating film (or ILD: Inter Level Dielectric), and is formed of a titanium nitride film (TiN), for example. The core material 22 is formed of, for example, polysilicon.

In step S102, a spacer is formed. More specifically, as illustrated in FIGS. 4A through 4D, a spacer 23 with the same degree of film thickness as the line width of the core material 22 is formed so as to cover upper surfaces and side surfaces of the core materials 22. The spacer 23 has an etching selectivity different from an etching selectivity of the core materials 22, and is formed of silicon dioxide ($SiO_2$), for example.

In step S103, the core materials 22 are exposed. More specifically, as illustrated in FIGS. 5A through 5D, for example, the spacers 23 are etched until the upper surfaces of the core materials 22 are exposed by dry etching such as reactive ion etching (RIE). At this time, the spacers 23 are etched so as to be left on the side surfaces of the core materials 22. For example, carbon tetrafluoride ($CF_4$) can be used as the etching gas.

In step S104, a sacrificial film is formed. More specifically, as illustrated in FIGS. 6A through 6D, a sacrificial film 24 is formed to cover the upper surface of the insulating film 21, the upper surfaces of the core materials 22, the upper surfaces of the spacers 23 and the side surfaces of the spacers 23. The method for forming the sacrificial film 24 is not limited to a specific method, but, for example, a spin coating method is preferable in which a solution containing a material of the sacrificial film 24 is supplied to the upper surfaces of the insulating film 21, the core materials 22, and the spacers 23 while rotating the insulating film 21, the core materials 22, and the spacers 23. By forming the sacrificial film 24 using the spin coating method, the upper surface of the sacrificial film 24 can be made flat and smooth, thereby increasing the lithography margin. After applying the solution containing the material of the sacrificial film 24 to the upper surfaces of the insulating film 21, the core materials 22 and the spacers 23 by the spin coating, the stack may be heated at a low temperature (e.g., 100 degrees C.) and dried as necessary. The sacrificial film 24 has an etching selectivity different from those of the core material 22 and the spacer 23, and, for example, is formed of a metal oxide such as aluminum oxide (AlO), titanium oxide (TiO), zirconium oxide (ZrO).

In step S105, a first resist pattern is formed. More specifically, as illustrated in FIGS. 7A through 7D, a resist film 25 is formed on the sacrificial film 24. Then, the resist film 25 is patterned by being exposed by an ArF laser having a wavelength of 193 nm while using a dark field mask with an opening at a predetermined location as an exposure mask, and then by being developed. Thus, a first resist pattern 25m with an opening 25a at a predetermined location is formed. The predetermined location is described later. For example, a chemically amplified resist may be used as a material of the resist film 25. For example, an antireflective film may be formed before forming the resist film 25 on the sacrificial film 24. For example, a stacked film of a silicon-containing antireflective coating (SiARC) and a spin on carbon (SOC) film may be used as the antireflective film.

In step S106, the sacrificial film 24 is etched by using the first resist pattern 25m as an etching mask. More specifically, as illustrated in FIGS. 8A through 8D, the sacrificial film 24 is etched until the upper surfaces of the core materials 22 and the spacers 23 are exposed at the location where the opening 25a was formed, by dry etching such as RIE by using the first resist pattern 25m as an etching mask. Thus, a recess 24a where the upper surfaces of the core material 22, the upper surfaces of the spacers 23 and the upper surfaces of the sacrificial films 24 (see FIGS. 4B and 4D, the middle portion) are exposed is formed. At this time, the etching is performed so as to leave the sacrificial film 24 formed on the side surfaces of the spacers 23. For example, chlorine ($Cl_2$) may be used as an etching gas.

In step S107, a second resist pattern is formed. More specifically, as illustrated in FIGS. 9A through 9D, a resist film 25 is formed on the sacrificial film 24. Then, the resist film 25 is patterned by being exposed by an ArF laser having a wavelength of 193 nm while using a dark field mask with an opening at a predetermined location as an exposure mask, and then by being developed. Thus, a second resist pattern 25n with an opening 25b at a predetermined location is formed. The predetermined location is described later. For example, a chemically amplified resist may be used as a material of the resist film 25. For example, the first resist film 25m may be removed before forming the resist film 25 on the sacrificial film 24, or for example, an antireflective film may be formed. For example, a stacked film of SiARC and SOC may be used as the antireflective film.

In step S108, the sacrificial film 24 is etched by using the second resist pattern 25n. More specifically, as illustrated in FIGS. 10A through 10D, the sacrificial film 24 is etched until the upper surfaces of the core material 22 and the spacer 23 is exposed at the location where the opening 25a was formed, by dry etching such as RIE by using the second resist pattern 25n as an etching mask. Thus, a recess 24b where the upper surfaces of the core material 22, the upper surfaces of the spacers 23 and the upper surface of the sacrificial film 24 (see FIG. 10C) are exposed, is formed. At this time, the etching is performed so as to leave the sacrificial film 24 formed on the side surfaces of the spacers 23. For example, chlorine ($Cl_2$) may be used as an etching gas.

In step S109, the second resist pattern 25n is removed. More specifically, as illustrated in FIGS. 11A through 11D, the resist film 25 remaining on the core materials 22, the spacers 23 and the sacrificial film 24 is removed by ashing, for example.

In step S110, the core materials 22 are etched by using the sacrificial film 24 as an etching mask. More specifically, as illustrated in FIGS. 12A through 12D, the core materials 22 are etched by dry etching such as RIE while using the sacrificial film 24 as an etching mask. As an etching gas, a gas whose etching rate for the core material 22 is higher than the etching rate for the spacer 23 and the sacrificial film 24 can be used. For example, when the core materials 22 are formed of polysilicon; the spacers 23 are formed of $SiO_2$; and the sacrificial film 24 is formed of a metal oxide, HBr may be used as the etching gas, for example. Thus, even when the upper surfaces of the spacers 23 and the upper surface of the sacrificial film 24 are exposed, the core materials 22 can be selectively etched while hardly etching the spacers 23 and the sacrificial film 24.

In step S111, the sacrificial films 24 are etched. More specifically, as illustrated in FIGS. 13A through 13D, the sacrificial films 24 included in the openings 24a and 24b are etched (see FIGS. 11C and 11D). As an etching gas, a gas whose etching rate for the sacrificial film 24 is higher than the etching rate for the core material 22 and the spacer 23 can be used. For example, when the core materials 22 are formed of polysilicon; the spacers 23 are formed of $SiO_2$; and the sacrificial film 24 is formed of a metal oxide, $Cl_2$ may be used as the etching gas, for example. Thus, even when the upper surfaces of the spacers 23 are exposed, the sacrificial film 24 can be selectively etched while hardly etching the spacers 23.

In step S112, the insulating film 21 is etched by using the core materials 22, the spacers 23 and the sacrificial films 24 as an etching mask. More specifically, as illustrated in FIGS. 14A through 14D, the insulating film 21 is etched by dry etching such as RIE while using the core materials 22, the spacers 23 and the sacrificial films 24 as an etching mask. Thus, a via hole 26 is formed at a location where the core materials 22, the spacers 23 and the sacrificial films 24 are not formed.

In step S113, the sacrificial films 24 are removed. More specifically, as illustrated in FIGS. 15A through 15D, the sacrificial films 24 are removed by dry etching such as RIE. Here, when the sacrificial films 24 are a metal oxide, $Cl_2$ can be used as the etching gas, for example.

In step S114, the core materials 22 are removed. More specifically, as illustrated in FIGS. 16A through 16D, the core materials 22 are removed by dry etching such as RIE. Here, when the core materials 22 are polysilicon, for example, HBr can be used as the etching gas.

In step S115, a conductive film is formed. More specifically, as illustrated in FIG. 17A through 17D, conductive films 27 are formed on the side surfaces of the via hole 26 penetrating through the insulating film 21 and the spacers 23. Thus, the metal films 11 formed in the first layer 10 (see FIG. 1) are electrically connected with the conductive films 27, and the metal films 31 of the third layer 30 made of the conductive film 27 is formed on the insulating film 21. In other words, because the conductive films 27 can be formed on the side surfaces of the via hole 26 and the spacers 23, the locations of the via holes 26 of the second layer 20 and the locations of the metal films 31 match with each other.

The pattern forming method according to the embodiment has the following operation and effect.

Figure 18A:
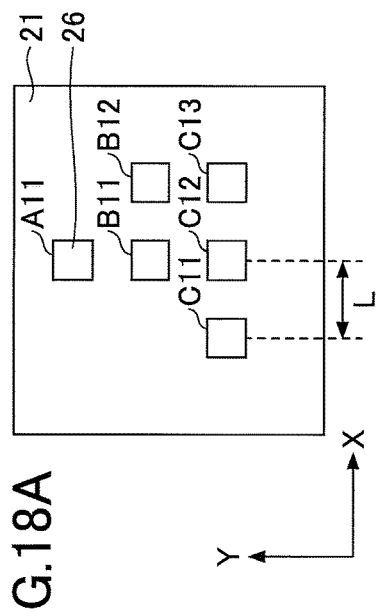
FIGS. 18A through 18E are diagrams for explaining a via hole forming method by using conventional pattern forming method.

FIGS. 18A through 18E are diagrams for explaining a method for forming via holes at a predetermined location by a conventional pattern forming method. FIG. 18A is a diagram for explaining an arrangement of the via holes in FIG. 1. FIGS. 18B through 18E are diagrams for explaining an exposure mask to form via holes. In FIG. 18A, a distance between the adjacent via holes 26 is assumed to be smaller than the resolution limit of the photolithography technology.

In the conventional pattern forming method, as illustrated in FIG. 18A, when a distance L between the adjacent via holes 26 is smaller than the resolution limit of the photolithography technology, if a resist film is patterned by using a single exposure mask, the adjacent via holes 26 are not separated from each other and are liable to contact with each other. To prevent this, when the distance L between the adjacent via holes 26 is the resolution limit or less, the resist film is patterned by dividing the single exposure mask into a plurality of exposure masks so that the distance L between the adjacent via holes 26 becomes a dimension resolvable by using the photolithography technology. In other words, a plurality of exposure processes is performed.

Figure 18E:
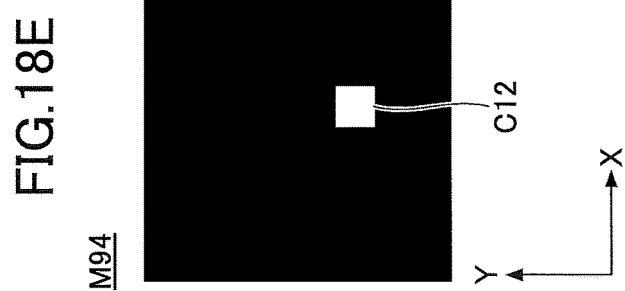
Figure 18D:
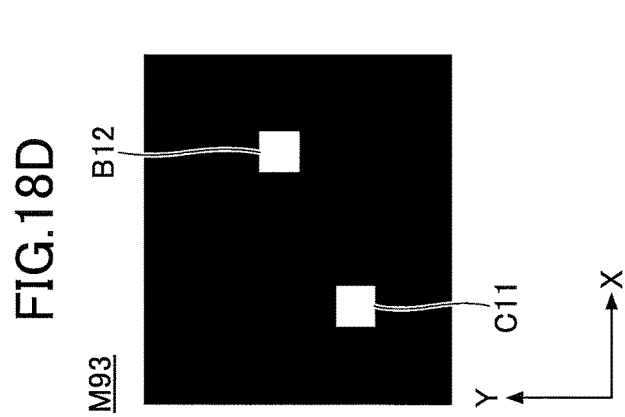
Figure 18C:
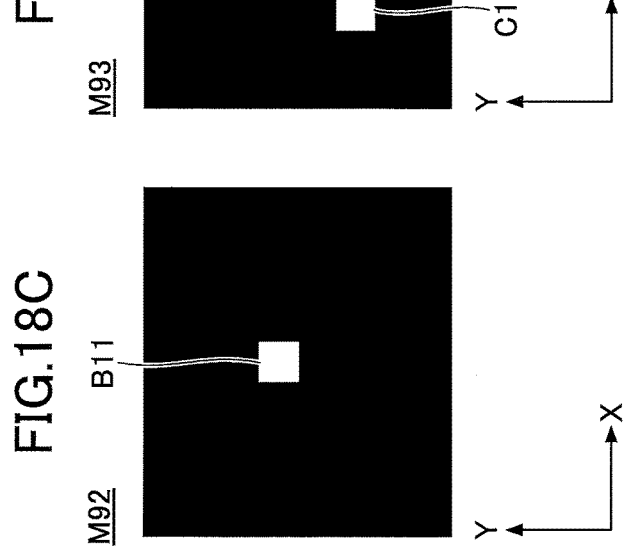
Figure 18B:
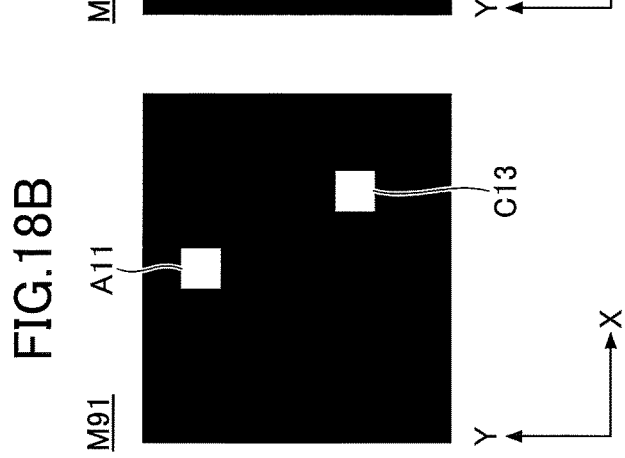

More specifically, as illustrated in FIG. 18B, the exposure is performed by using an exposure mask M91 having openings with areas A11 and C13 that are resolvable by using the lithography technology. Next, as illustrated in FIG. 18C, an exposure is performed by using an exposure mask M92 having an opening with an area B11. Subsequently, as illustrated in FIG. 18D, an exposure is performed by using an exposure mask having openings with areas B12 and C11 that are resolvable by using the photolithography technology. Next, as illustrated in FIG. 18E, an exposure is performed by using an exposure mask M94 having an opening with an area C12. Thus, when a plurality of via holes 26 are formed at predetermined locations of the insulating film 21, a plurality of exposure processes (four times in the example in FIGS. 18A through 18D) needs to be performed by using a plurality of exposure masks M91, M92, M93 and M94.

Figure 19A:
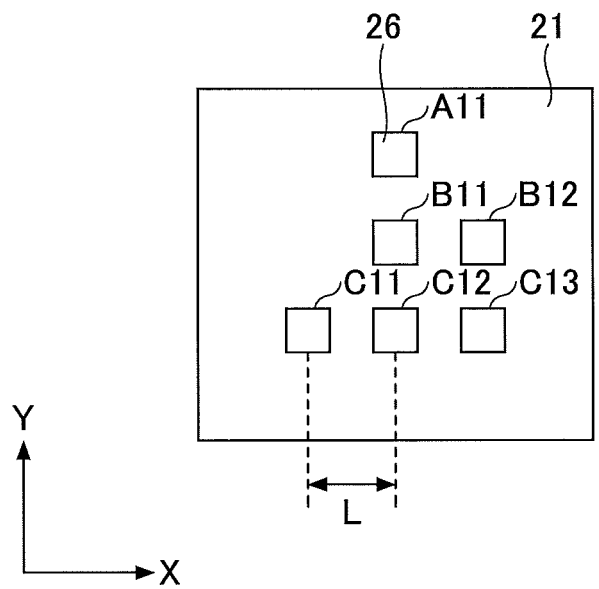
FIGS. 19A through 19C are diagrams for explaining a via hole forming method by using a pattern forming method according to an embodiment.
Figure 19B:
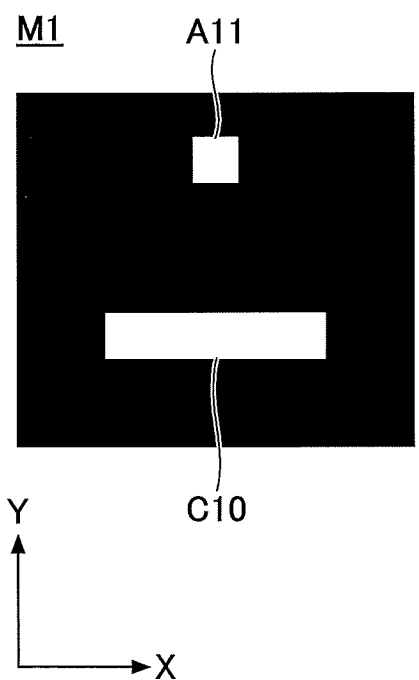
Figure 19C:
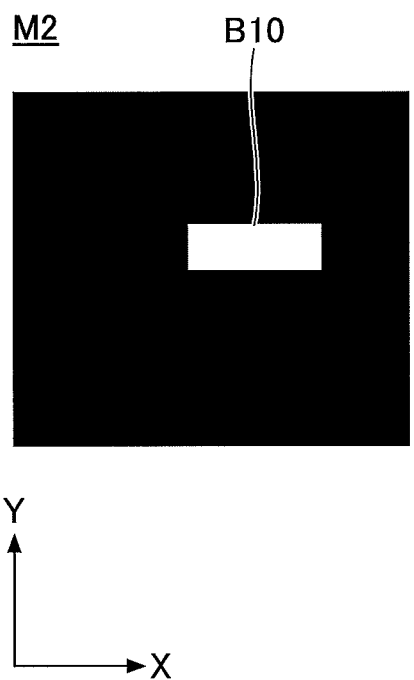

FIGS. 19A through 19C are diagrams for explaining a method for forming via holes at predetermined locations by the pattern forming method according to the embodiment. FIG. 19A is a diagram for explaining the arrangement of the via holes in FIG. 1. FIGS. 19B and 19C are diagrams for explaining the exposure mask for forming the via holes illustrated in FIG. 19A. In FIG. 19A, the distance between the adjacent via holes 26 is assumed to be smaller than the resolution limit of the photolithography technology.

In the embodiment, the repeated line pattern is formed of three types of films having different etching selectivities. Thus, as illustrated in FIG. 19A, even when the distance L between the adjacent via holes 26 is smaller than the resolution limit of the photolithography technology, the adjacent via holes 26 can be formed in a repetitive direction (X direction in FIGS. 19A through 19C) by using a single exposure mask.

More specifically, as illustrated in FIGS. 19B, to begin with, the exposure is performed by using an exposure mask M1 having an opening with an area A and an opening with an area C10 including areas C11, C12 and C13. Here, although the distance between the area C11 and the area C12 and the distance between the area C12 and the area C13 are smaller than the photolithography limit, the repetitive line pattern is formed of three types of films having different etching selectivities in the embodiment. Hence, these via holes 26 can be formed by a single exposure process by using a single exposure mask.

Subsequently, as illustrated in FIG. 19C, the exposure is performed by using an exposure mask M2 having an opening with an area B1 including areas B11 and B12. Here, although the distance between the area B11 and the area B12 is smaller than the photolithography limit, the repetitive line pattern is formed of three types of films having different etching selectivities in the embodiment. Hence, these via holes 26 can be formed by a single exposure process by using a single exposure mask.

Thus, in the embodiments, the number of the utilized exposure mask can be made fewer than the conventional exposure process. As a result, the manufacturing cost can be reduced, and variations in process can be reduced.

In the embodiments, the insulating film 21 is an example of the under film, and the core material 22 is an example of the first film. The spacer 23 is an example of the second film, and the sacrificial film 24 is an example of the third film. Moreover, the first resist pattern 25m and the second resist pattern 25n are examples of the resist patterns, and the via hole 26 is an example of a through hole.

As discussed above, the pattern forming method according to the embodiments can reduce the number of exposure processes in pattern formation by using a 1D layout technology.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A pattern forming method, comprising steps of:

forming a first film having a repetitive line patterned shape on an under film, the first film having a first etching selectivity;

forming a second film on a side surface of the first film, the second film having a second etching selectivity that is different from the first etching selectivity;

forming a third film on an upper surface and a side surface of the second film without removing the first film, the third film having a third etching selectivity that is different from the first etching selectivity and the second etching selectivity;

forming a resist pattern on the third film, the resist pattern having an opening;

forming a recess that exposes an upper surface of the first film, the upper surface of the second film and an upper surface of the third film by etching the third film by using the resist pattern as an etching mask;

exposing an upper surface of the under film by etching the first film and the third film having the exposed upper surfaces in the recess so as to leave the second film having the exposed upper surface in the recess; and forming a through hole that penetrates through the under film by etching the under film having the exposed upper surface.

2. The pattern forming method according to claim 1, further comprising steps of:

removing the first film and the third film so as to leave the second film in the recess after the step of forming the though hole that penetrates through the under film; and forming a conductive film in the through hole and on the side surface of the second film.

3. The pattern forming method according to claim 2, wherein the under film is an insulating film formed on an interconnection layer, and wherein the step of forming the conductive film in the through hole and on the side surface of the second film comprises electrically connecting the conductive film to the interconnection layer.

4. The pattern forming method according to claim 1, wherein the step of forming the first film comprises forming a polysilicon film having the repetitive line patterned shape on the under film, wherein the step of forming the second film comprises forming a silicon oxide film on the side surface of the first film, and wherein the step of forming the third film comprises forming a film made of a metal oxide on the upper surface and the side surface of the second film without removing the first film.

5. The pattern forming method according to claim 4, wherein the third film is formed by applying a solution containing the metal oxide to the upper surface and the side surface of the second film by spin coating.

* * * * *